United States Patent
Zhang et al.

(10) Patent No.: US 7,078,108 B2
(45) Date of Patent: Jul. 18, 2006

(54) PREPARATION OF HIGH-STRENGTH NANOMETER SCALE TWINNED COATING AND FOIL

(75) Inventors: Xinghang Zhang, Los Alamos, NM (US); Amit Misra, Los Alamos, NM (US); Michael A. Nastasi, Santa Fe, NM (US); Richard G. Hoagland, Santa Fe, NM (US)

(73) Assignee: The Regents of the University of California, Los Alamos, NM (US)

(*) Notice: Subject to any disclaimer, the term of this patent is extended or adjusted under 35 U.S.C. 154(b) by 93 days.

(21) Appl. No.: 10/891,323

(22) Filed: Jul. 14, 2004

(65) Prior Publication Data
US 2006/0014039 A1 Jan. 19, 2006

(51) Int. Cl.
*B32B 3/30* (2006.01)
*B32B 3/10* (2006.01)
*B32B 5/16* (2006.01)
*B32B 15/16* (2006.01)
*B32B 15/18* (2006.01)

(52) U.S. Cl. .............. 428/579; 428/548; 428/559; 428/601; 428/685

(58) Field of Classification Search .............. None
See application file for complete search history.

(56) References Cited

U.S. PATENT DOCUMENTS

| | | | | |
|---|---|---|---|---|
| 3,617,223 A | * | 11/1971 | Boatman | 117/203 |
| 3,988,593 A | * | 10/1976 | Dewey, Jr. | 359/326 |
| 5,290,674 A | * | 3/1994 | Hirano et al. | 430/567 |
| 6,033,783 A | * | 3/2000 | Tanaka et al. | 428/408 |
| 6,706,469 B1 | * | 3/2004 | Takada | 430/569 |
| 2003/0067003 A1 | * | 4/2003 | Gole et al. | 257/64 |

OTHER PUBLICATIONS

X. Zhang, A. Misra, H. Wang, M. Nastasi, J. D. Embury, T. E. Mitchell, R. G. Hoagland, and J. P. Hirth, Nanoscale-Twinning-Induced Strengthening In Austenitic Stainless Steel Films', Applied Physics Letters, vol. 84, No. 7, pp. 1096-1098, Feb. 2004.

X. Zhang, A. Misra, H. Wang, T. D. Shen, M. Nastasi, T. E. Mitchell, J. P. Hirth, R. G. Hoagland, and J. D. Embury, "Enhanced Hardening in Cu/330 Stainless Steel Multilayers By Nanoscale Twinning," Acta Materialia, vol. 52, pp. 995-1002, 2004.

(Continued)

*Primary Examiner*—Jennifer McNeil
*Assistant Examiner*—Jason L. Savage
(74) *Attorney, Agent, or Firm*—Samuel L. Borkowsky (57) ABSTRACT

Very high strength single phase stainless steel coating has been prepared by magnetron sputtering onto a substrate. The coating has a unique microstructure of nanometer spaced twins that are parallel to each other and to the substrate surface. For cases where the coating and substrate do not bind strongly, the coating can be peeled off to provide foil.

31 Claims, 7 Drawing Sheets

OTHER PUBLICATIONS

Helena Van Swygenhoven, "Grain Boundaries and Dislocations," Science, vol. 296, pp. 66-67, Apr. 2002.

Yinmin Wang, Mingwell Chen, Fenghua Zhou, and En Ma, "High Tensile Ductility In A Nonostructured Metal," Nature, vol. 419, pp. 912-915, Oct. 2002.

C. C. Koch, D. G. Morris, K. Lu, and A. Inoue, "Ductility of Nanostructured Materials," MRS Bulletin, pp. 54-58, Feb. 1999.

Milton Ohring, "The Materials Science of Thin Films," Academic Press, San Diego, pp. 118-133, pp. 420-431, 1992.

Michael Nastasi, James W. Mayer, and James K. Hirvonen, "Ion-Solid Interactions: Fundamentals and Applications," Cambridge University Press, pp. 363-385.

D. B. Knorr and D. P. Tracy, "A Review of Microstructure in Vapor Deposited Copper Thin Films," Materials Chemistry and Physics, vol. 41, pp. 206-216, 1995.

Michael Bauccio, "ASM Metals Reference Book, Third Edition," p. 366.

George E. Dieter, "Mechanical Metallurgy, Third Edition," McGraw-Hill International Editions, Materials Science and Engineering Series, p. 137, pp. 188-191, 1986.

L. E. Murr, E. Moin, F. Greulich, and K. P. Staudhammer, "The Contribution of Deformation Twins To Yield Stress: The Hall-Petch Law For Inter-Twin Spacing," Scripta Metallurgica, vol. 112, pp. 1031-1035, 1978.

B. P. Kashyap and K. Tangri, "On the Hall-Petch Relationship and Substructural Evolution in Type 316L Stainless Steel," Acta Metall. Mater., vol. 43, No. 11, pp. 3971-3981, 1995.

K. J. Kurzydlowski, B. Ralph, J. J. Bucki, and A. Garbacz, "The Grain Boundary Character Distribution Effect On The Flow Stress of Polycrystals: The Influence of Crystal Lattice Texture," Materials Science and Engineering, A205, pp. 127-132, 1996.

Denis Y. W. Yu and Frans Spaepen, "The Yield Strength of Thin Copper Films on Kapton," American Institute of Physics, vol. 95, No. 6, pp. 2991-2997, Mar. 2004.

H. J. Schneider-Muntau, Nhmfl and K. Han, Nhmfl, "Materials Research for Advanced Magnets," From the Chief Scientist's Desk, J. Robert Schrieffer, pp. 5-8.

* cited by examiner

PREPARATION OF HIGH-STRENGTH NANOMETER SCALE TWINNED COATING AND FOIL

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates generally to high strength materials and more particularly to a high strength metallic foil and/or coating having a plurality of nanometer spaced twin planes that are parallel to each other.

BACKGROUND OF THE INVENTION

The mechanical behavior of nanostructured materials having grain sizes of less than about 100 nanometers (nm) has received significant attention recently due to the high strengths achievable in these materials (see, for example, H. Van Swygenhoven, Science, vol. 296 (2002) pp. 66). However, there are limitations for the very smallest grain sizes; severe plastic deformation based methods do not readily yield grain sizes of a few nanometers (see, for example: Y. Wang, M. Chen, F. Zhou, and E. Ma, Nature (London) vol. 419 (2002) pp. 912).

Single phase nanostructured materials synthesized by such well known methods as powder compaction and electrodeposition, for example, often have defects such as porosity or chemical impurities. Generally, the strength of this type of material increases with decreasing grain size until a maximum strength is reached. However, experiments reveal that the strength of a single phase nanostructured material decreases when the grain size is reduced below about 10 nanometers (see, for example: C. C. Koch, D. G. Morris, K. Lu, and A. Inoue, MRS Bull, vol. 24 (1999) pp. 54). Due to these limitations, there remains a need for alternate methods for preparing single-phase, high-strength nanostructured materials.

Accordingly, an object of the present invention is to provide a method of preparing single phase, high strength, nanostructured materials.

Another object of the invention is to provide a method of improving wear resistance of an article.

Yet another object of the invention is to provide high strength stainless steel coating and foil.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

In accordance with the purposes of the present invention, as embodied and broadly described herein, the present invention includes a metallic foil having a surface and a plurality of twin planes that are substantially parallel to the surface and parallel to each other and are separated by a twin plane spacing distance of from about 0.5 nm to about 60 nm.

The invention also includes an article of manufacture having a coating. The coating has a surface and a plurality of twin planes that are substantially parallel to the surface and parallel to each other and are separated by a twin plane spacing distance of from about 0.5 nm to about 60 nm.

The invention also includes a method for coating a surface. The method includes depositing a coating onto a surface, the coating having a twinned structure with a plurality of twin planes. Twin planes of the coating are separated by a twin plane spacing distance of from about 0.5 nm to about 60 nm.

The invention also includes an article of manufacture. The article includes an object with a coating. The coating has a twinned structure with a plurality of twin planes. Twin planes are separated by a twin plane spacing distance of from about 0.5 nm to about 60 nm, and the object and the coating have essentially the same chemical composition.

BRIEF DESCRIPTION OF THE DRAWINGS

The accompanying drawings, which are incorporated in and form a part of the specification, illustrate the embodiment(s) of the present invention and, together with the description, serve to explain the principles of the invention. In the drawings:

FIG. 1c shows a schematic diagram of the nanoscale twinned structure produced by sputter depositing 330 SS. Essentially, the microstructure has subdivided itself into two crystallographic orientations, that are arbitrarily labeled as matrix (m) and twin (t) in the schematic. Twins have formed during growth, with a preferred twin orientation of twin planes being normal to the film growth direction, giving rise to a layered arrangement of twins (as opposed to randomly oriented twins). The spacing between twins is on the order of a couple to a few nanometers.

DETAILED DESCRIPTION

The invention is related to single phase, layered, twinned materials. Using a magnetron sputter deposition process, extremely hard, stainless steel (SS) coatings and foil have been synthesized. These coatings and foil have a measured hardness of about 7 GPa, which is about an order of magnitude higher than the hardness of the corresponding stainless steel in other forms. High-resolution transmission electron microscopy (HRTEM) images reveal that these sputter deposited coatings and foil include a layered arrangement of alternating, nanometer-spaced twins on {111} planes. The layered twinned structures are oriented parallel to the film surface, the twin planes being normal to the growth direction. Molecular dynamics (MD) simulations provided insight into why these layered twinned structures are so strong.

The foil prepared according to this invention relates to metal in sheet form. While the invention has been demonstrated for preparing coating and very thin sheet (foil having a thickness of several tens of microns), it should be understood that the invention could also be used for preparing much thicker sheets of twinned materials.

Importantly, the invention is not limited by any particular substrate shape; flat, round, and irregularly shaped substrates could also be modified according to this invention.

The invention was demonstrated by sputter depositing face-centered cubic (fcc) austenitic 330 SS target material onto a substrate. The 330 SS sputtering target used was about 4 inches in diameter and included a composition of iron (43 percent by weight), chromium (18 percent by weight), nickel (36 percent by weight), manganese (2 percent by weight), and carbon (0.08 percent by weight).

The coatings and foil produced using this sputtering target had a thickness of several micrometers (μm). The thickness of the foil and coating produced according to this invention is related to the deposition time used. Shorter times produce thinner coatings and foil, while longer times produce thicker coatings and foil.

Generally, foil is produced by depositing metal onto a substrate that the metal does not strongly adhere to. Foil was produced using this invention by sputter depositing 330 SS onto substrates such as glass, and oxide-coated silicon (Si). After sputter deposition, the metal coating was peeled off the substrate to produce metal foil.

By contrast, when the adherence of the sputter deposited metal is strong, then the deposit can be used as a coating.

A magnetron gun was used for sputter deposition. The target and the substrate were separated by a distance of about 4 inches.

Sputter deposition has been described, for example, by M. Ohring in "The Material Science of Thin Films," Academic Press (1992). Briefly, a coating of the present invention is prepared as follows. First, the sputtering chamber is evacuated to a base pressure of about $5 \times 10^{-8}$ torr. After the chamber is evacuated, then argon gas having a pressure of about 5 millitorr is admitted into the chamber. Afterward, about 400 Watts of dc power are applied to a magnetron gun. The target is attached to the gun, so application of the dc powder results in application of the dc power to the target, which results in removal of target material from the target and deposition of removed target material onto the substrate. Under these conditions, when 330 SS was used as the target, the deposition rate was about 0.5 nanometers per second. Deposition is continued for a period of time to deposit a desired amount of target material.

Some of the coating and foil deposited according to this invention involved applying a negative dc bias to the substrate of up to about 300 volts. This bias resulted in the production of argon ions that bombarded the deposit during deposition. Results indicate that the argon ion bombardment altered the intrinsic, growth residual stress of the coating (for a discussion related to intrinsic, growth residual stress, see, for example M. Nastasi, J. W. Mayer, and J. K. Hirvonen, "Ion-Solid Interactions: Fundamentals and Applications", Cambridge University Press, (1996), chapter 13, p 363; and M. Ohring, The Material Science of Thin Films, Academic Press (1992), p 420).

Many coatings and foil samples were prepared in order to demonstrate the reproducibility of the method of the invention, and to examine the effect of residual stress on the microstructures and hardness of the resulting coatings and foil.

Figure 1A:
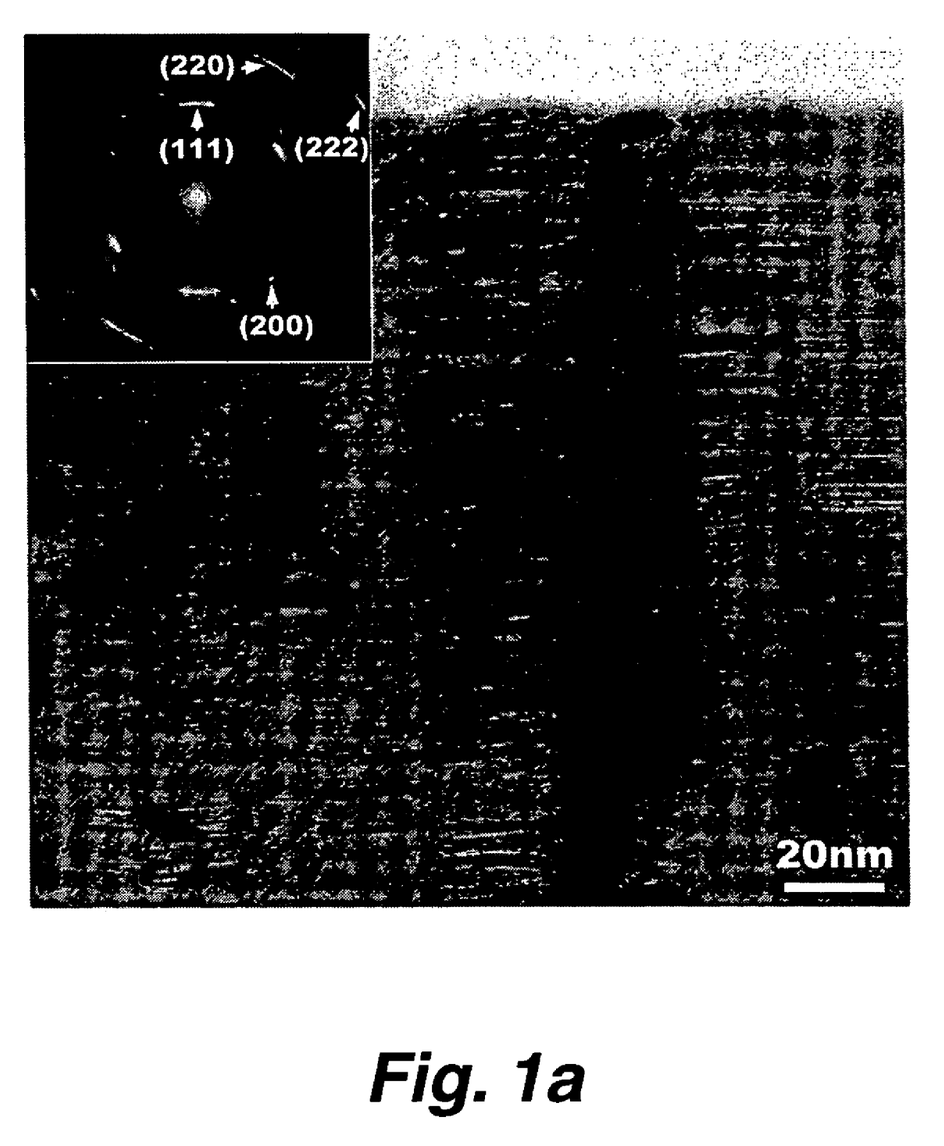
FIG. 1a shows a bright field transmission electron microscopy (TEM) image of a 330 stainless steel (SS) film of the invention with an average columnar grain size of about 30 nanometers; the image shows high density of planar defects within the columnar grains. The selected area diffraction pattern in the inset shows a <111> texture.

The invention may be better understood using the accompanying figures. FIG. 1a shows a bright field transmission electron microscopy (TEM) image of a cross-section of a 330 SS film. The image shows an average columnar grain size of about 30 nanometers and <111> texture. This type of columnar grain structure with <111> texture for face centered cubic metals is typical in room temperature vapor deposited films (see, for example: D. B. Knorr and D. P. Tracy, Materials Chemistry and Physics, vol. 41 (1995) pp. 206–216). An aspect of the invention relates to the unexpected finding of an extremely high density of planar defects within the columnar grains, as seen in FIG. 1a.

Figure 1B:
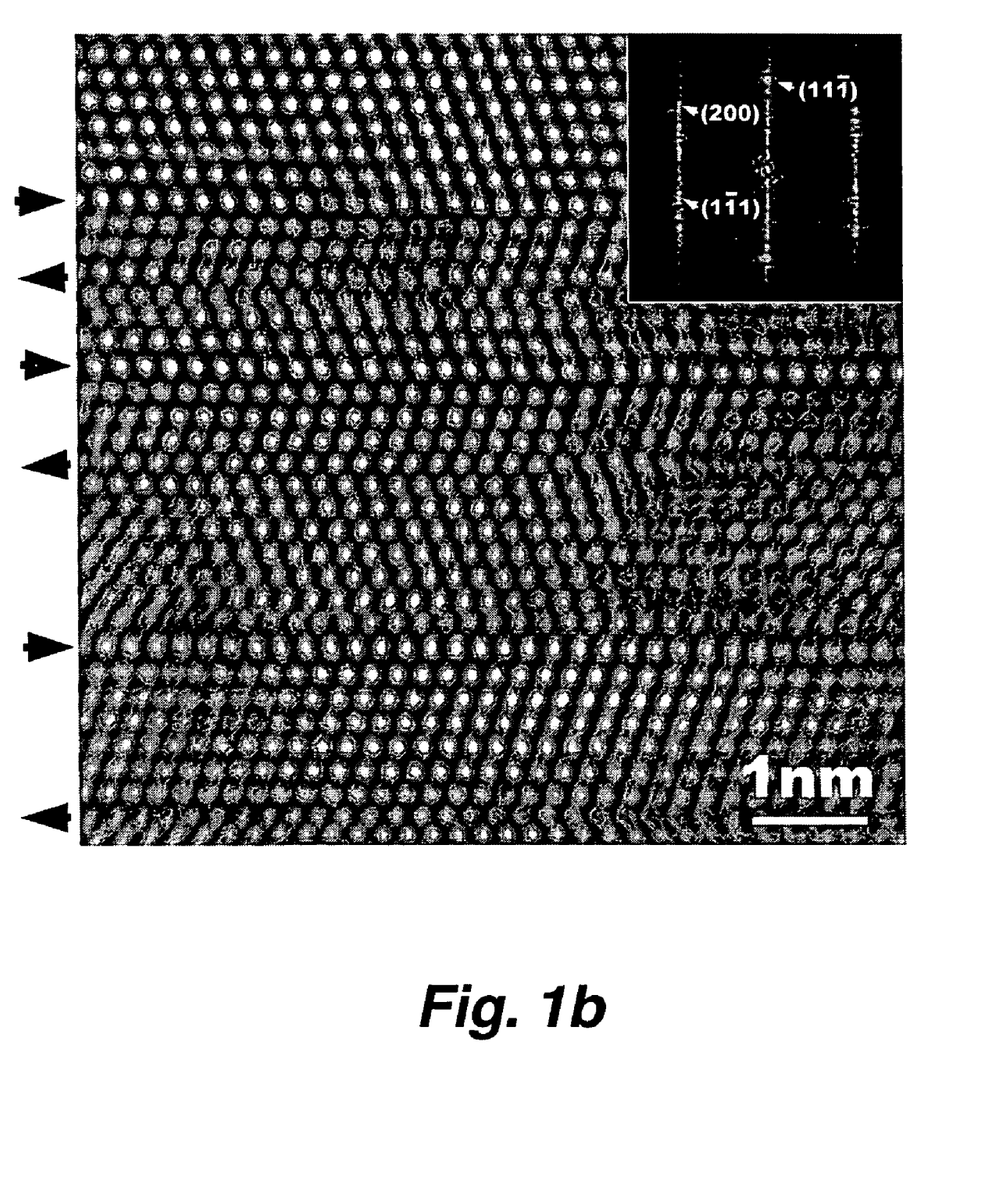
FIG. 1b shows a high resolution transmission electron microscopy (HRTEM) image of 330 SS film deposited with no substrate bias; the image shows the layered geometry of nanometer-spaced {111} twins with arrows indicating twin interfaces; the inset shows fast Fourier transform from the corresponding image.

FIG. 1b shows an atomic resolution TEM image of the planar defects that are shown at a lower magnification view in FIG. 1a. The "planar defects" in the structure are actually twins on {111} planes, as evidenced by the zigzag arrangement of the atomic planes across the {111} planes. In this unexpected arrangement, the twins take on a preferred {111} plane that is parallel to the film surface producing a layered geometry of the twinned structure, and the spacing between twins is on the order of several nanometers.

Figure 1C:
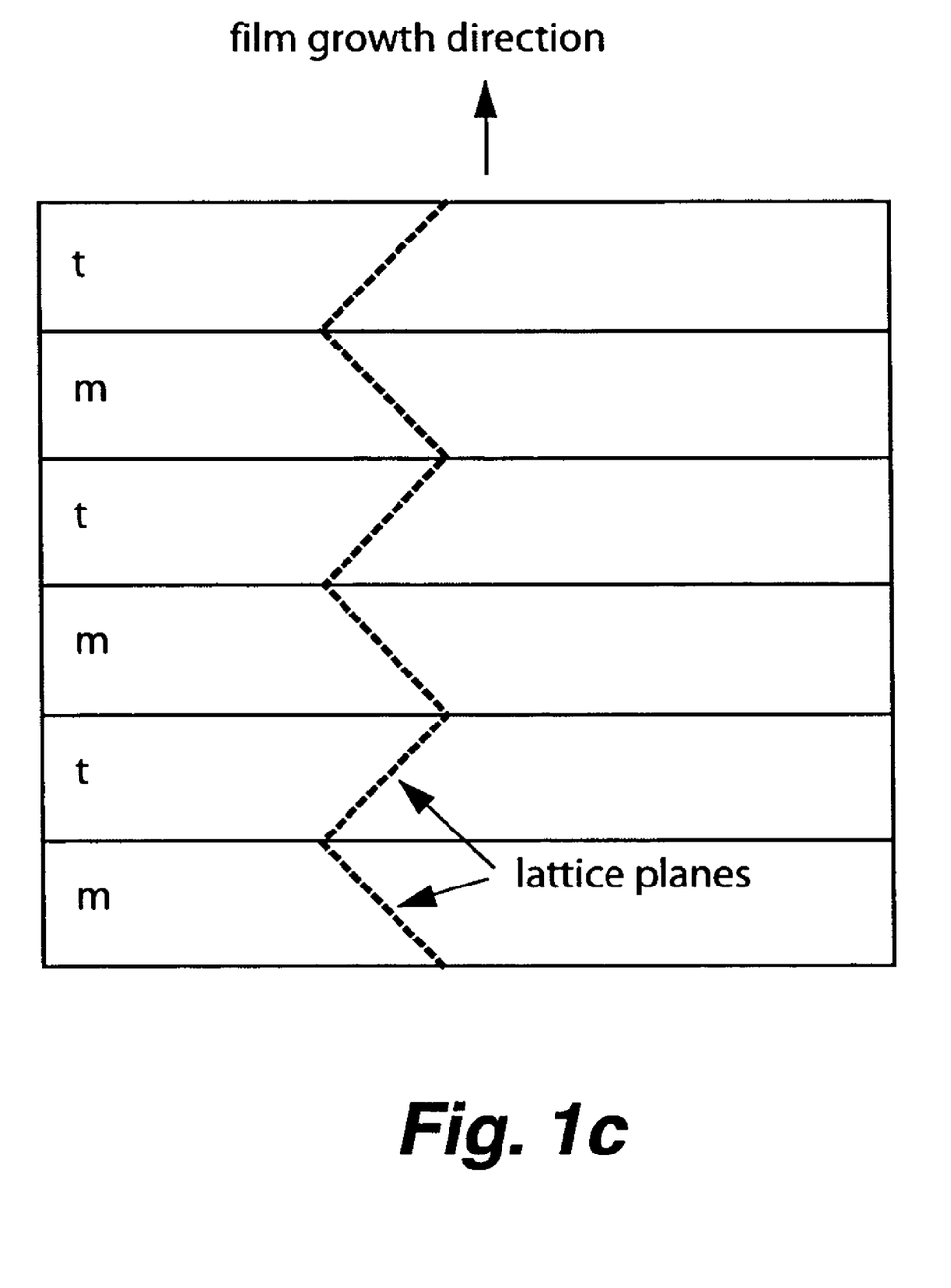

The layered zigzag structure is shown schematically in FIG. 1c. The twinned structure forms during growth. The growth direction is indicated by the arrow pointing away from and normal to the substrate surface. The preferred orientation of twin planes is normal to the film growth direction, and gives rise to the observed layered arrangement of twins; randomly oriented twins apparently do not form.

Figure 2:
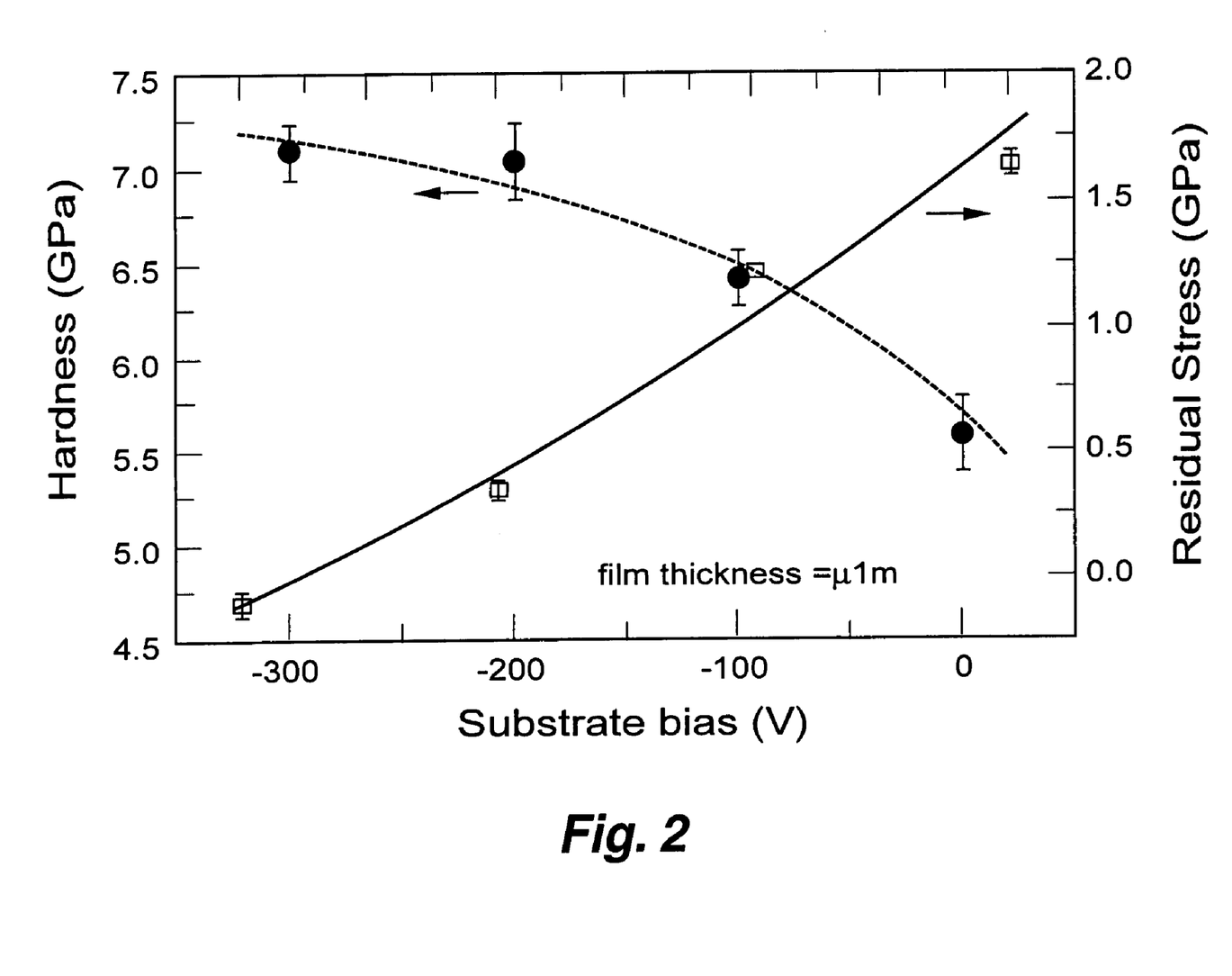
FIG. 2 shows a HRTEM image showing nanoscale growth twins on {111} in sputtered 330 SS films.

The mechanical properties of the nanoscale, twinned structure of the invention were investigated. Indentation experiments were performed to measure the Young's modulus and hardness of the structure, and wafer substrate curvature experiments were performed to measure residual stress. The results are shown in FIG. 2, a graphical summary showing the evolution of hardness and residual stress in 330 stainless steel films of the invention as a function of substrate bias during magnetron sputtering. As FIG. 2 shows, films deposited without any substrate bias have an in-plane tensile residual stress of about 1.5 GPa that reduces to almost zero as the negative substrate bias (i.e. increasing argon ion bombardment during deposition) is increased to 300 volts (V). While the Young's modulus of the vapor-deposited layer of 330 SS was on the same order as that for bulk 330 SS (about 200 GPa), the hardness of the film of the invention, as measured by indentation, exceeds 7 GPa, which is much higher than the hardness of bulk 330 SS (which is about 0.6 GPa, as inferred from the yield strength data given in ASM Metals Reference Book, $3^{rd}$ edition, ASM International (1993) p. 366).

The residual stress-free films that were produced with a bias of about −300 volts appear to have the highest hardness. Also, the nanometer-spaced twinned structure of the films of the invention does not appear to change with changes in the residual stress in the film.

Figure 3:
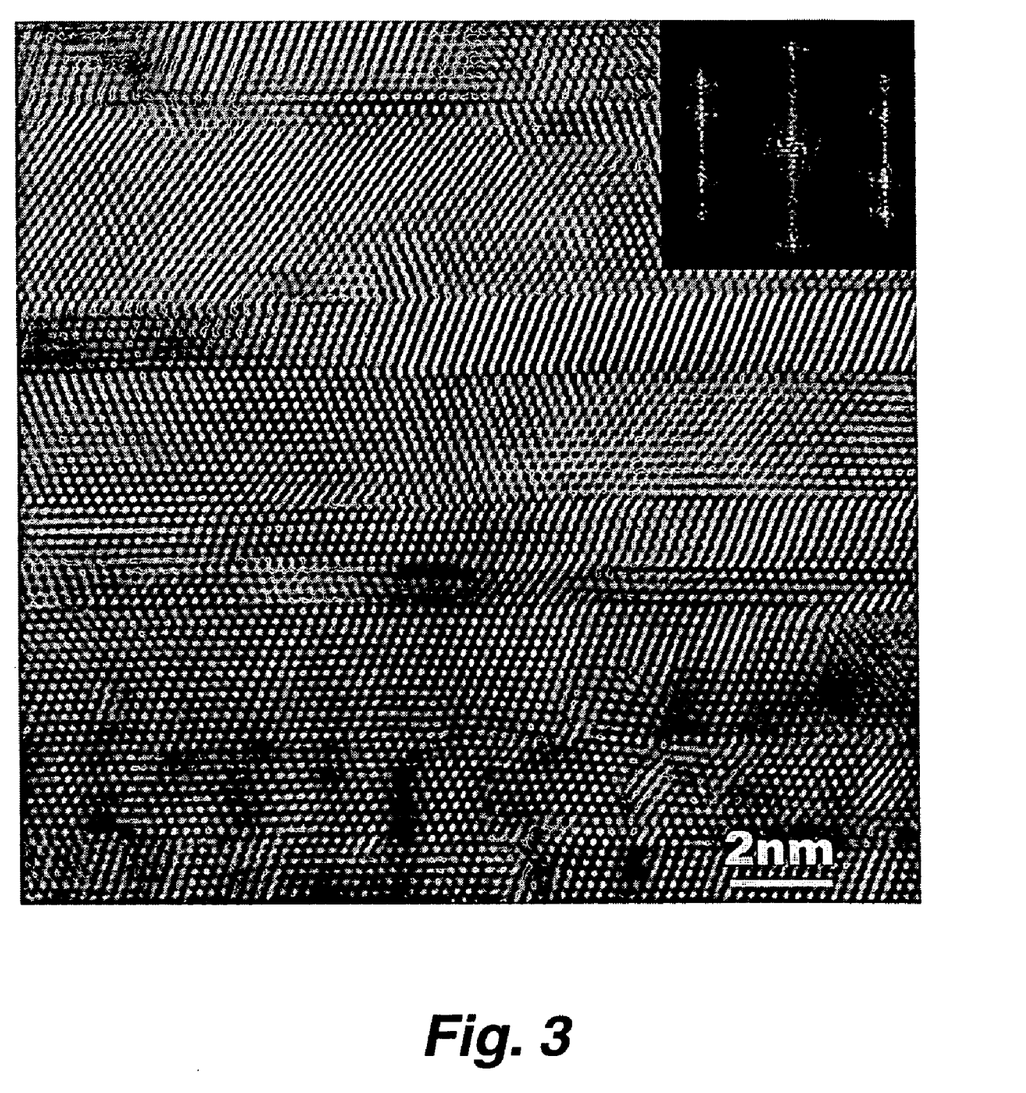
FIG. 3 shows a HRTEM image of 330 SS film deposited with a −300 volt substrate bias. Comparison with FIG. 1b indicates that the layered geometry of nanometer spaced {111} twins is independent of the film residual stress.

FIG. 3 shows a HRTEM image of a 330 SS coating of the invention deposited on silicon using a −300 volt bias. The image of FIG. 3 is similar to the image of FIG. 1b.

Figure 4:
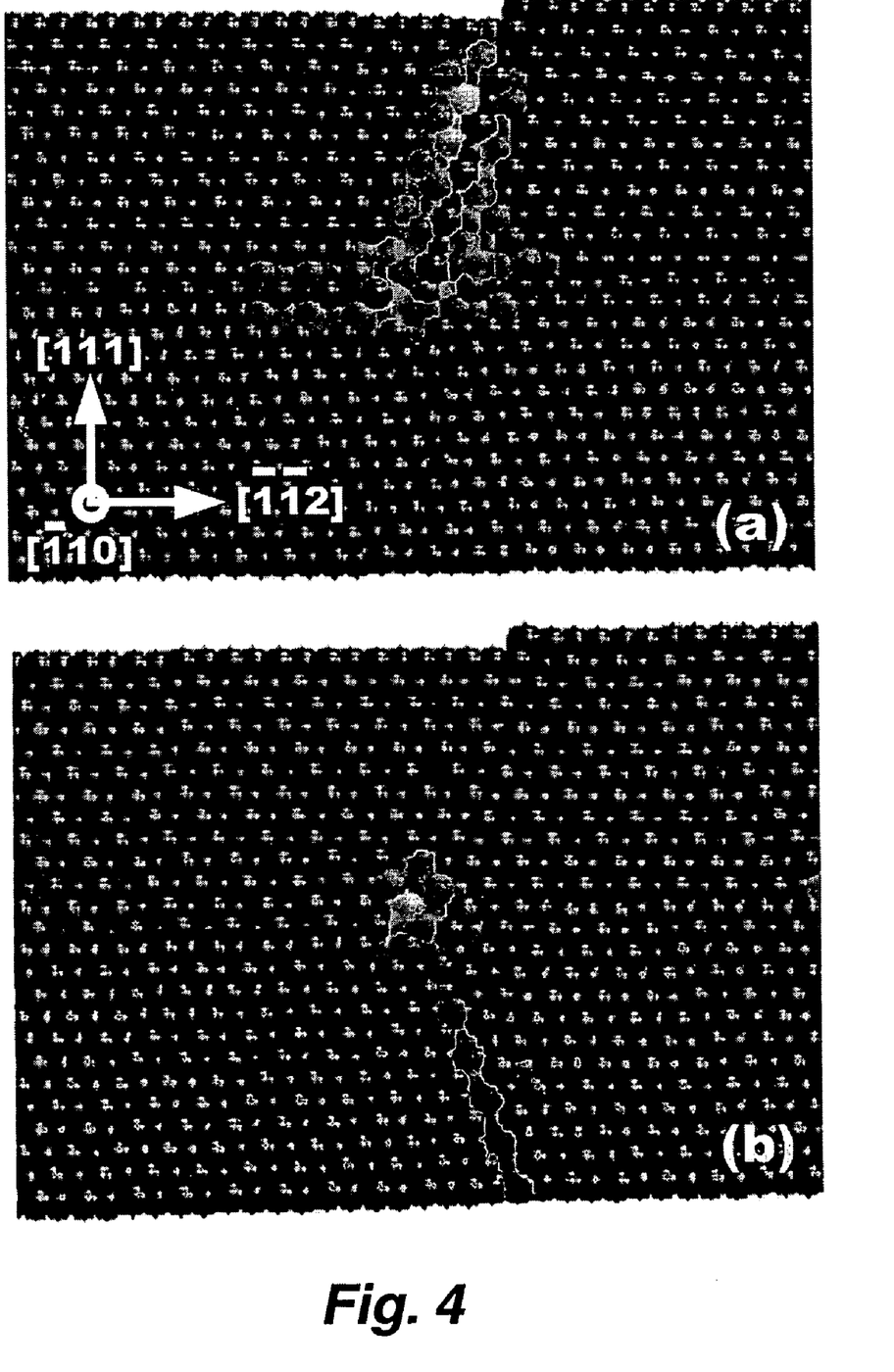
FIG. 4 shows images from a molecular dynamics simulation of a single dislocation transmission across a twin boundary in face centered cubic (fcc) metals. The simulation shows that twins can be very effective obstacles to single dislocation transmission.

While not intending to be bound by any particular explanation, one possible mechanism that explains the origin of the high strength of the twinned coating and foil of this invention is now described. Molecular dynamics (MD) were used to investigate the role of a {111} twin interface in blocking single dislocation transmission in face-centered-cubic (fcc) metals. In FIG. 4, the upper and lower lattices are in a Σ3 twin orientation with respect to each other and the twin interface is a symmetric {111} plane. The models were periodic in the direction parallel to the dislocation line, which was straight, and had fixed boundary conditions in the other two directions. Although fixed, the boundaries contained the displacement field of a dislocation near the interface. Thus, image forces on the dislocation due to incompatibility between the dislocation position defining the boundary atom displacements and the actual position of the dislocation core were very small or negligible when interface crossing occurs. The models were two periods thick in the periodic direction and were otherwise fully 3D. A perfect dislocation with $b=\frac{1}{2}[101]$, residing in the upper crystal (FIG. 4) is subjected to a uniaxial tensile stress. To move this dislocation across the interface into the lower crystal, a resolved shear stress of 1.77 GPa has to be applied. The Burgers vector changes as the dislocation moves onto the complementary glide plane in the lower layer. Consequently, a Shockley partial dislocation with $b=\frac{1}{6}[112]$ remains at the interface after the perfect dislocation crosses the twin interface. Since the experiment was performed at 0 Kelvin, the resolved shear stress may be decreased somewhat by thermal activation at room temperature. Nevertheless, the simulations show that twin boundaries can be very strong obstacles to transmission of single glide dislocations.

While no model has been developed to explain why the spacing of twins is only a few nanometers, it is believed that the high density of twins may be related to the low stacking fault energy (SFE) of austenitic stainless steels. The invention may thus be extended to other low stacking fault energy materials produced by vapor deposition. Examples of low SFE materials include austenitic stainless steels (SFE of from about 10 to about 40 mJ/m$^2$); silver (SFE of about 25 mJ/m$^2$); brass (SFE of about 10 mJ/m$^2$); and the like. Materials such as copper would be in the medium SFE range (SFE of about 80 mJ/m$^2$), while nickel (SFE of about 150 mJ/m$^2$) and aluminum (SFE of about 200 mJ/m$^2$) (see, for example: G. Dieter, Mechanical Metallurgy, 3$^{rd}$ edition, McGraw-Hill (1986) p. 137).

Alloying can be used to reduce SFE. Alloying copper with zinc, for example, produces a-brass with much lower SFE than pure copper. Since some of these materials, such as copper, are widely used as electrical conductors but performance is often limited by mechanical strength (e.g. conductors in high field magnets rupture if the force from the magnetic field exceeds the mechanical strength), this approach may be used to design electrical conductors having high mechanical strength.

Other depositing techniques besides sputter deposition could be used to prepare a high strength, nanometer scale twinned coating and/or foil. Examples of other deposition methods include, but are not limited to, pulsed laser deposition, electron beam evaporation, chemical vapor deposition, electrodeposition, and the like.

Figure 5:
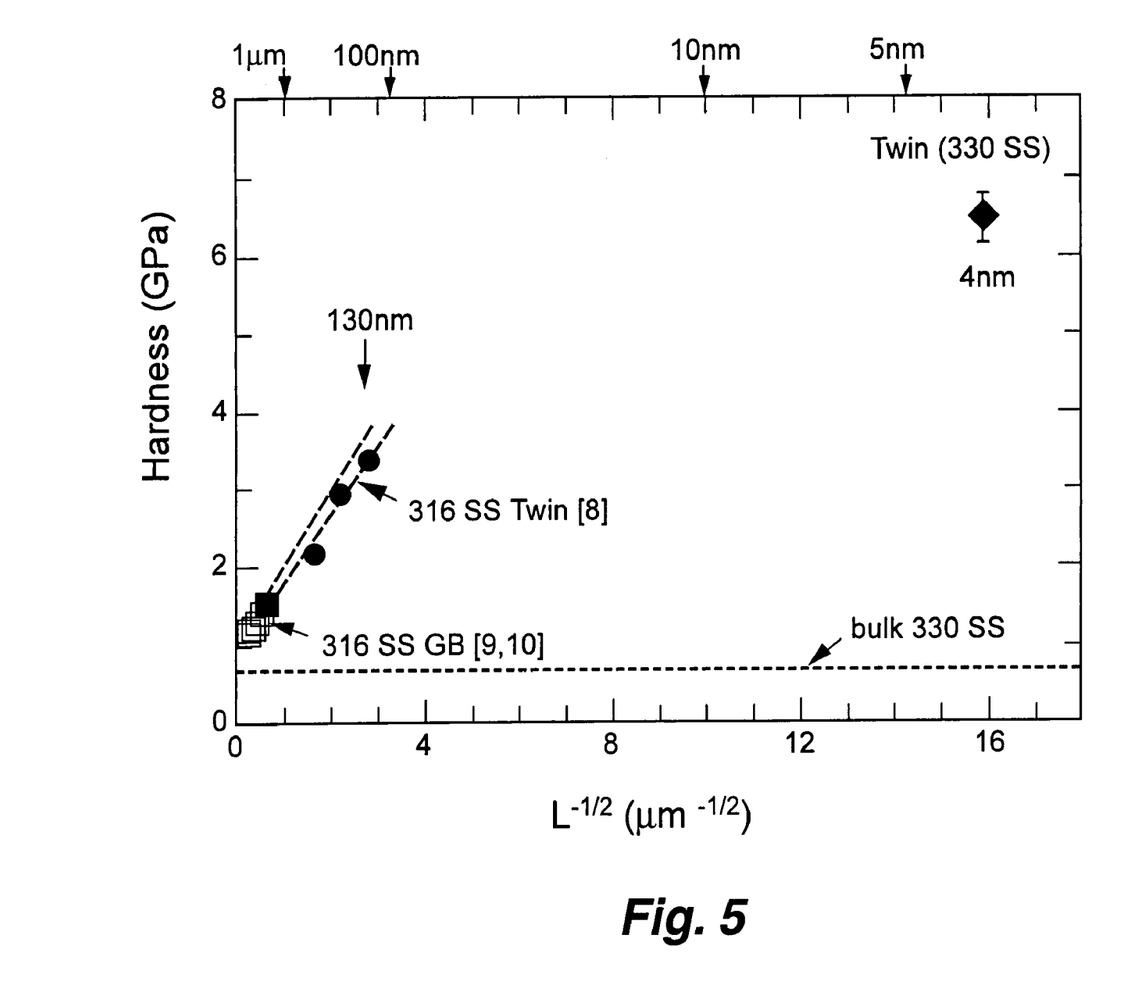
FIG. 5 shows a graphical comparison of hardness of bulk austenitic stainless steels with the vapor-deposited twinned 330 SS of the present invention.

The production of twinned structures in bulk materials is well known. For example, twinned structures have been introduced into bulk materials using shock loading. Twins produced via shock loading are randomly oriented and have spacing in the range of a few tens to hundreds of nanometers. By contrast, twins produced by sputter deposition according to this invention are oriented parallel to each other and to the surface of the substrate, and the twin planes are separated by a distance on the order of a few nanometers. Consequently, coatings produced using this invention are much harder than those produced using shock loading. Data that relate hardness versus the grain size (or the distance between twin planes of a twinned material) are plotted in the graph shown in FIG. 5. In FIG. 5, hardness data are plotted with $L^{-1/2}$ (L is the twin spacing or grain size). See: L. E. Murr, E. Moin and F. Greulich, Scripta Metall., vol. 12 (1978) p. 1031; B. P. Kashyap and K. Tangri, Acta Metall. Mater., vol. 43 (1995) p. 3971; and K. J. Kurzydlowski, B. Ralph, J. J. Bucki and A. Garbacz, Mater. Sci. Eng. A, vol. 205 (1996) p. 127). As FIG. 5 indicates, the incremental increase of hardness with a decrease in either grain size or spacing between the twin planes is approximately linear for a grain size or twin spacing (i.e. the distance between twin planes) of about 100 nanometers or larger. The increased hardness with reduced twin spacing is comparable to the increased hardness with reduced grain size, indicating that twins (in spite of being much lower energy defects than grain boundaries) are as effective as grain boundaries in increasing the hardness of the material. A linear relation between hardness and $L^{-1/2}$ is the well-known Hall-Petch scaling law (see, for example: G. E. Dieter, Mechanical Metallurgy, 3$^{rd}$ edition, McGraw-Hill (1986), p. 189); this is based on the concept of dislocation pile-ups at grain or twin boundaries that act as obstacles to slip. As the grain size (or twin spacing) increases, the dislocation pile-up length increases, thereby producing a larger local stress concentration at the tip of the pile-up and requiring lower external applied stress to cause yielding in the material. As the grain (or twin) spacing is reduced to a few nanometers, there is no room to form dislocation pile-ups and thus, the hardness versus $L^{-1/2}$ scaling is not valid. As FIG. 5 shows, the hardness of the material of the invention does not fall on the hardness versus $L^{-1/2}$ extrapolation. In nanometer-spaced barriers, slip must occur by the single dislocation transmission mechanism shown by the molecular dynamics simulation (FIG. 4).

The invention has been demonstrated by preparing high strength stainless steel coatings and SS foil. These materials prepared using this invention, and others that may be prepared, can be used for a wide variety of applications. The surface hardness and wear resistance of stainless steel articles of all shapes and sizes may be improved using this invention. This is especially important for the chemical and power engineering industries, which account for more than one third of the market for all stainless steel products. These products include, but not limited to, nuclear reactor vessels, heat exchangers, oil industry tubulars, components for chemical processing and pulp and paper industries, furnace parts, and boilers used in fossil fuel electric power plants, welding electrodes, high voltage switches, advanced active-cooling devices such as first wall, diverter interactive components, and magnetically confine fusion reactors. The invention may be used to improve the performance of these products, and other products, by providing them with a higher strength coating with perhaps increased wear resistance. Stainless steel products that are used in the automotive and aerospace industry, and for cryogenic applications, may also be modified using this invention. The invention can be used to provide a wide variety of biomedical devices with a high strength, wear resistant coating. Numerous medical and surgical devices that could be coated with a high strength, nanometer scale twinned coating according to this invention include orthopedic joints, stainless steel devices such as plates and spikes used for spinal fixation, and dental implants. Stainless steel surgical tools, such as scalpels, forceps, stents, and other commonly used medical tools could be modified by depositing a coating using this invention in order to improve their surface hardness and surface strength.

In summary, high strength coatings and foil have been produced according to the present invention. Insight into the strength of these materials has been provided via molecular dynamics simulations, which suggest that nanospaced twinned structures are resistant to slip transmission. While randomly oriented growth twins in materials such as copper have been reported (see, for example: D. Y. Y. Yu and F. Spaepen, Journal of Applied Physics, 15 Mar. 2004, vol. 95, no. 6, pp. 2991–2997), the twinned structures of this invention include twin planes that are parallel to the substrate surface with a twin plane spacing distance on the order of nanometers. Importantly, without compromising the corrosion resistance and biocompatibility of stainless steel, the hardness and wear resistance of stainless steel may be significantly increased using this invention.

The foregoing description of the invention has been presented for purposes of illustration and description and is not intended to be exhaustive or to limit the invention to the precise form disclosed, and obviously many modifications and variations are possible in light of the above teaching.

The embodiment(s) were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A metal foil comprising a surface and a plurality of metal twin planes that are substantially parallel to the surface and parallel to each other and are separated from each other by a twin plane spacing distance of from about 0.5 nm to about 60 nm.

2. The metal foil of claim 1, wherein said foil comprises a material selected from the group consisting of iron, chromium, nickel, manganese, and mixtures thereof.

3. The metal foil of claim 1, wherein said foil comprises iron, chromium, nickel, manganese, and carbon.

4. The metal foil of claim 1, wherein said foil comprises about 43 weight percent iron, about 18 weight percent chromium, about 36 weight percent nickel, about 2 weight percent manganese, and about 0.08 weight percent carbon.

5. The metal foil of claim 1, wherein adjacent twin planes are separated by a distance of from about 0.5 nm to about 50 nm.

6. The metal foil of claim 1, wherein adjacent twin planes are separated by a distance of from about 0.5 nm to about 25 nm.

7. The metal foil of claim 1, wherein adjacent twin planes are separated by a distance of from about 0.5 nm to about 10 nm.

8. The metal foil of claim 1, wherein said foil has a face-centered cubic crystallographic structure.

9. The metal foil of claim 1, wherein said foil comprises a hardness of from about 5.5 GPa to about 7 GPa.

10. An article of manufacture having a coating, the coating comprising a surface and a plurality of metal twin planes that are substantially parallel to the surface and parallel to each other and wherein adjacent twin planes are separated from each other by a twin plane spacing by a distance of from about 0.5 nm to about 60 nm.

11. The article of manufacture of claim 10, wherein said coating comprises a material selected from the group consisting of iron, chromium, nickel, manganese, and mixtures thereof.

12. The article of manufacture of claim 10, wherein said coating comprises iron, chromium, nickel, manganese, and carbon.

13. The article of manufacture of claim 10, wherein said coating comprises about 43 weight percent iron, about 18 weight percent chromium, about 36 weight percent nickel, about 2 weight percent manganese, and about 0.08 weight percent carbon.

14. The article of manufacture of claim 10, wherein adjacent twin planes of said coating are separated from each other by a distance of from about 0.5 nm to about 50 nm.

15. The article of manufacture of claim 10, wherein adjacent twin planes of said coating are separated from each other by a distance of from about 0.5 nm to about 25 nm.

16. The article of manufacture of claim 10, wherein adjacent twin planes of said coating are separated from each other by a distance of from about 0.5 nm to about 10 nm.

17. The article of manufacture of claim 10, wherein said coating comprises a face-centered cubic crystallographic structure.

18. The article of manufacture of claim 10, wherein said coating comprises a hardness of from about 5.5 GPa to about 7 GPa.

19. An article of manufacture comprising an object having a coating, the coating comprising a twinned structure having a plurality of metal twin planes that are separated from each other by a twin plane spacing distance of from about 0.5 nm to about 60 nm, wherein the object and the coating have essentially the same chemical composition.

20. The article of manufacture of claim 19, wherein said object and said coating comprise a material selected from the group consisting of iron, chromium, nickel, manganese, and mixtures thereof.

21. The article of manufacture of claim 19, wherein said object and said coating comprise iron, chromium, nickel, manganese, and carbon.

22. The article of manufacture of claim 19, wherein said object and said coating comprise about 43 weight percent iron, about 18 weight percent chromium, about 36 weight percent nickel, about 2 weight percent manganese, and about 0.08 weight percent carbon.

23. The article of manufacture of claim 19, wherein adjacent twin planes of said coating are separated from each other by a distance of from about 0.5 nm to about 50 nm.

24. The article of manufacture of claim 19, wherein adjacent twin planes of said coating are separated from each other by a distance of from about 0.5 nm to about 25 nm.

25. The article of manufacture of claim 19, wherein adjacent twin planes of said coating are separated from each other by a distance of from about 0.5 nm to about 10 nm.

26. The article of manufacture of claim 19, wherein said coating comprises a face-centered cubic crystallographic structure.

27. The article of manufacture of claim 19, wherein said object and said coating comprise the same crystallographic structure.

28. The article of manufacture of claim 19, wherein said object and said coating comprise a face-centered cubic crystallographic structure.

29. The article of manufacture of claim 19, wherein said object comprises a different crystallographic structure from that for said coating.

30. The article of manufacture of claim 19, wherein said coating comprises a hardness greater than the hardness of the object.

31. The article of manufacture of claim 19, wherein the coating comprises a hardness of from about 5.5 GPa to about 7 GPa.

* * * * *